United States Patent [19]
Katz et al.

[11] 4,130,811
[45] Dec. 19, 1978

[54] MODULATION SYSTEM

[75] Inventors: Joel Katz, Los Angeles; Eugene H. Gregory, Tarzana, both of Calif.

[73] Assignee: Hughes Aircraft Company, Culver City, Calif.

[21] Appl. No.: 864,946

[22] Filed: Dec. 27, 1977

[51] Int. Cl.² .................................. H03C 3/00
[52] U.S. Cl. .................................. 332/18; 332/23 R
[58] Field of Search ............ 332/17, 18, 21, 23 R; 328/187; 331/21, 40, 56, 38

[56] References Cited
U.S. PATENT DOCUMENTS

| | | | |
|---|---|---|---|
| 2,478,973 | 8/1949 | Mahren | 331/40 |
| 3,037,190 | 5/1962 | Herbst | 332/21 |
| 3,100,284 | 8/1963 | Kerns | 331/56 |
| 3,300,726 | 1/1967 | Newman | 328/187 |

*Primary Examiner*—John Kominski
*Attorney, Agent, or Firm*—Elliott N. Kramsky; W. H. MacAllister

[57] ABSTRACT

A modulation system which produces a modulated carrier having a number of central sideband pairs with power closely approximating the carrier power. A signal generator produces a sinusoidal reference voltage which is applied to a plurality of conditioning channels. Amplitude, phase and frequency conditioning means within the channels produce desired modulating signal components. The components are then synthesized in a power combiner and applied as the control voltage to phase/frequency modulation means to produce the desired modulated signal.

11 Claims, 11 Drawing Figures

MODULATION SYSTEM

BACKGROUND OF THE INVENTION

1. Field of the Invention

The present invention relates to means for modulating a carrier and in particular to means for generating a modulated wave having a uniform distribution of power among the carrier and a prescribed number of central sideband pairs.

2. Description of the Prior Art

The nonlinear characteristics of amplifiers of the class C and traveling wave tube (TWT) type, and the attendant intermodulation distortion induced in multicarrier signals when processed thereby is recognized and well documented. See, for example, G. Berretta, R. A. Gaugh and J. Guijarro, "Predicting Amplifier Performance of Multicarriers" Microwave Journal (July 1975) at pg. 35. The origin of such multicarrier distortion lies in the fact that the multiple equal power carriers have arbitrary phase relationships. Such carriers interact to produce a resultant signal exhibiting a large amount of amplitude modulation (AM). This inherent envelope (AM) time domain ripple is undesirable since the amplification processes within the above-named amplifiers convert the AM to phase modulation which results in serious distortion of the amplified signal. The weight reduction and efficiency achieved by the use of nonlinear saturated amplifiers, as opposed, for instance, to the linear class A amplifier is significant and extremely desirable for many applications. Thus the generation of pure frequency or phase modulated multiple equal line spectra represents a considerable advance in terms of the utility of saturated amplifiers by extending their light weight, efficient operation to applications requiring multiple equal-line spectra.

It has been shown in the past that a pure FM signal may be generated having a carrier and first sideband pair of equal power. However, attempts to extend this concept have incurred the significant spectral intermodulation effects described supra. Thus the achievement of distortionless, efficient amplification of the multi-carrier equal power signal has been limited to the case of just three equal amplitude spectra, those of a carrier and first sideband pair.

SUMMARY OF THE INVENTION

According to the preferred embodiment of the invention there is provided an apparatus for generating a modulated wave having multiple sideband pairs of power equal to the carrier which comprises means for producing a sinusoidal signal, a fundamental channel having an input and an output, at least one harmonic channel having an input and an output, a power divider having an input and a plurality of outputs, said input in electrical connection with said means for producing a sinusoidal signal to accept said signal, and each output in electrical connection with the input of a channel to direct said signal to said fundamental channel and to said at least one harmonic channel, a frequency adjustment means in each of said channels to transform the frequency of said signal within each of said harmonic channels to an integer multiple of a fundamental frequency $\omega_m$ and to transform the frequency of said signal within said fundamental channel to said fundamental frequency $\omega_m$, a first amplitude adjustment means in said fundamental channel to scale the amplitude of said signal to $\Delta\omega$ where $\Delta\omega$ is the solution of $$J_0\left(\frac{\Delta\omega}{\omega_m}\right) = J_1\left(\frac{\Delta\omega}{\omega_m}\right),$$

an amplitude adjustment means in each of said harmonic channels to scale the amplitude of said signal to $i\Delta\omega$ where i is the integer frequency multiple of said harmonic channel, a power combiner to add the outputs of selected channels wherein said outputs are combined according to the amplitudes of the terms of the Fourier-Bessel expansion for a carrier modulated by a signal comprised of a number of frequencies, each of which is an integer multiple of a fundamental frequency, a voltage controlled oscillator whose unmodulated frequency is at the carrier frequency, said voltage controlled oscillator having a control input and an output channel, the output of said power combiner being input to said control input of said voltage controlled oscillator whereby the carrier signal is frequency modulated by the output of said power combiner, and a variable phase shift means in each of said harmonic channels to systematically adjust the relative phase of each harmonic channel to achieve said equal amplitude spectrum as predicted by said Fourier-Bessel expansion.

The modulation system constructed as above mentioned generates FM waves having multiple sideband spectra of power closely approximating the carrier power.

It is, therefore, the object of the present invention to provide a modulation system which generates "multi-carrier" waveforms which will incur minimal distortion when amplified by a saturated or nonlinear device.

Other objects, advantages and features of the invention will become apparent when considered in conjunction with the accompanying drawings wherein:

DESCRIPTION OF THE PREFERRED EMBODIMENT

Figure 1:
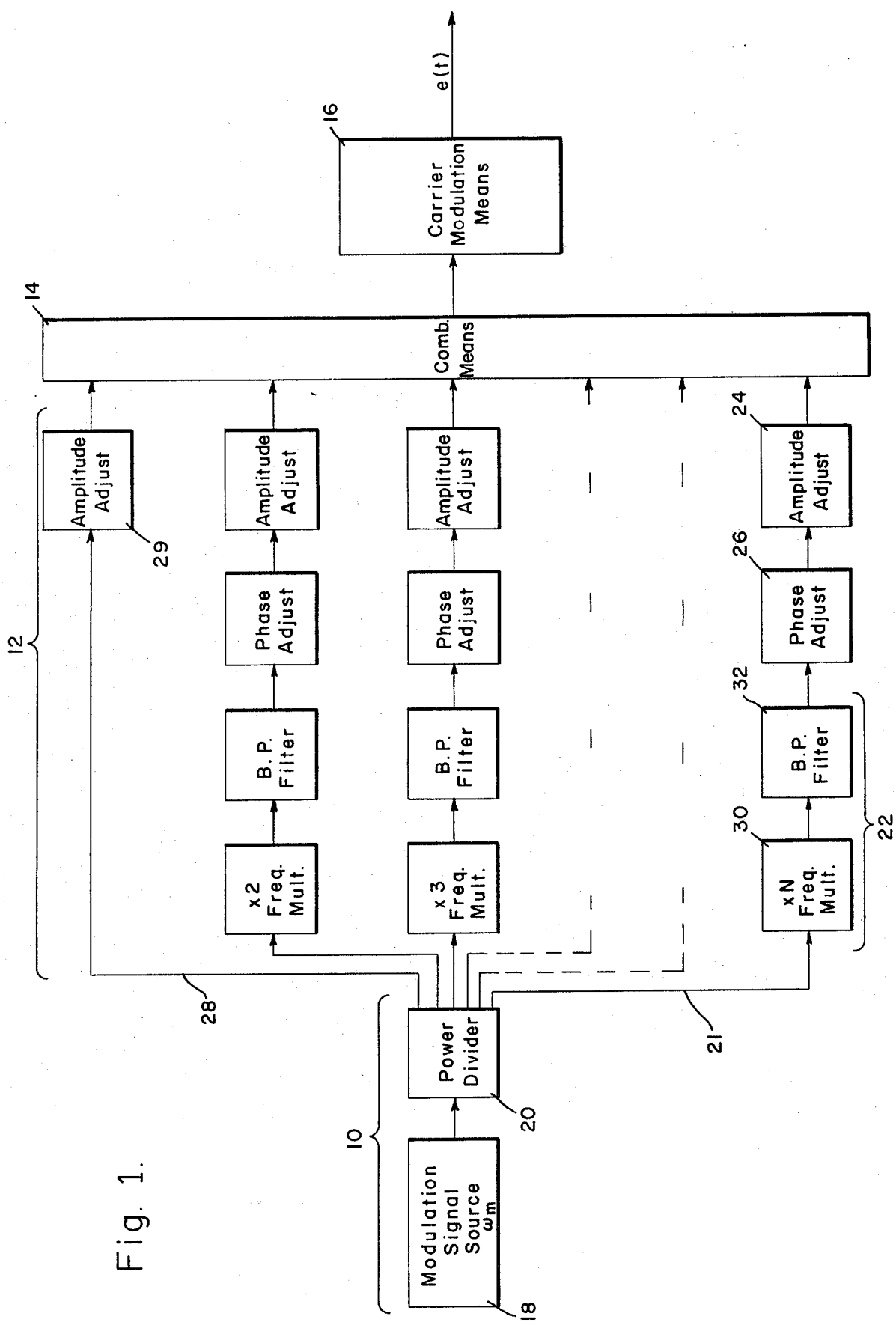
FIG. 1 is a schematic view of the generalized embodiment of the present invention.

The modulation system of the present invention is shown in a general form in FIG. 1. The system of FIG. 1 generates modulated waveforms having 2L sidebands of power closely approximating that of the carrier. The generalized modulation system comprises four functional groupings of elements. The functional groups are, from left to right of FIG. 1: the fundamental (modulation) frequency generation means 10; the modulation component conditioning means 12; the component combination means 14; and the carrier modulation means 16. Although their functions must be performed to achieve the advantages of the present invention, other generalized combinations may be devised and are contemplated within the scope of the present invention.

A sinusoid having the fundamental modulation frequency $\omega_m$ (expressed in radians per second) is generated by and directed to the plurality of conditioning channels which comprise the modulation component conditioning means 12 by the fundamental frequency generation means 10. The fundamental frequency generation means 10 comprises a modulation signal source 18, which generates a sinusoidal reference voltage of the fundamental modulation frequency, $\omega_m$, coupled with the power divider 20 which directs the sinusoid to the plurality of conditioning channels. All but one of the conditioning channels (taking the N-harmonic channel 21 as typical) contains a frequency multiplication means 22 (such as a frequency multiplier coupled with a limiter or bandpass filter), an amplitude scaling means 24 (such as an amplifier or attenuator) and a phase varying means 26 (such as a phase shifter). All such apparatus are well established and considered standard in the electronics art. Their combination as shown in FIG. 1 allows one, by proper parameter selection, to practice all variations within the scope of the present invention. One channel of the modulation component conditioning means 12, the fundamental channel 28, is seen to have an amplitude adjustment means 29 but, unlike the other (harmonic) channels, no means for phase or frequency adjustment. Thus the output of the fundamental channel 28 is a sinusoid of the fundamental modulation frequency $\omega_m$ in phase with the output of modulation signal source 18. The modulation wave components generated by the remaining plurality of (harmonic) channels are phased with respect to the fundamental channel 28. The frequency multiplication means 22 of the N-harmonic channel 21 is seen to comprise in combination a frequency multiplier 30 and bandpass filter 32 tuned to the harmonic of the channel. As the N-harmonic channel 21 has been taken for purposes of illustration, the frequency multipler 30 is an N-times multiplier and the bandpass filter 32 is set to the frequency $N\omega_m$. The amplitude scaling means 24 may comprise either an amplifier or an attenuator depending upon the relative amplitude of the channel's modulation frequency component (to be discussed) and the output of the modulation signal source 18. The phase varying means 26 may be set for a given (analytically predetermined) phase shift or may be of the adjustable type which is systematically varied to arrive at the specific phase relationship among modulating wave components which achieves the desired "equal" line spectrum. Such phase adjustment may be made with visual reference to the display of the modulated signal by a spectrum analyzer. The technique will be discussed infra.

The linear combination of selected outputs of the plurality of channels which comprise the modulation conditioning means 12 is achieved by the component combination means 14 which may consist of a standard linear power combiner. The linar combination of conditioned modulation components may be alternatively set within the power divider 20. That is, for a given spectral output, the power divider 20 might supply the fundamental modulating sinusoid only to those conditioning channels which provide a necessary frequency component of the composite modulating wave. The output of the power combiner is in turn fed into the carrier modulation means 16. The carrier modulation means 16 is a voltage responsive device which may be either a voltage controlled oscillator whose unmodulated frequency is at the carrier frequency, $\omega_c$, or a voltage controlled phase shifter that phase modulates the $\omega_c$ carrier supplied by a separate carrier source. The type of device employed as the carrier modulation means 16 will alter the type of modulation and the scaling of the plurality of channels which comprise modulation component conditioning means 12 to achieve the desired output spectrum. As will be seen, these adaptations remain within the scope of the generalized embodiment of FIG. 1.

Figure 2:
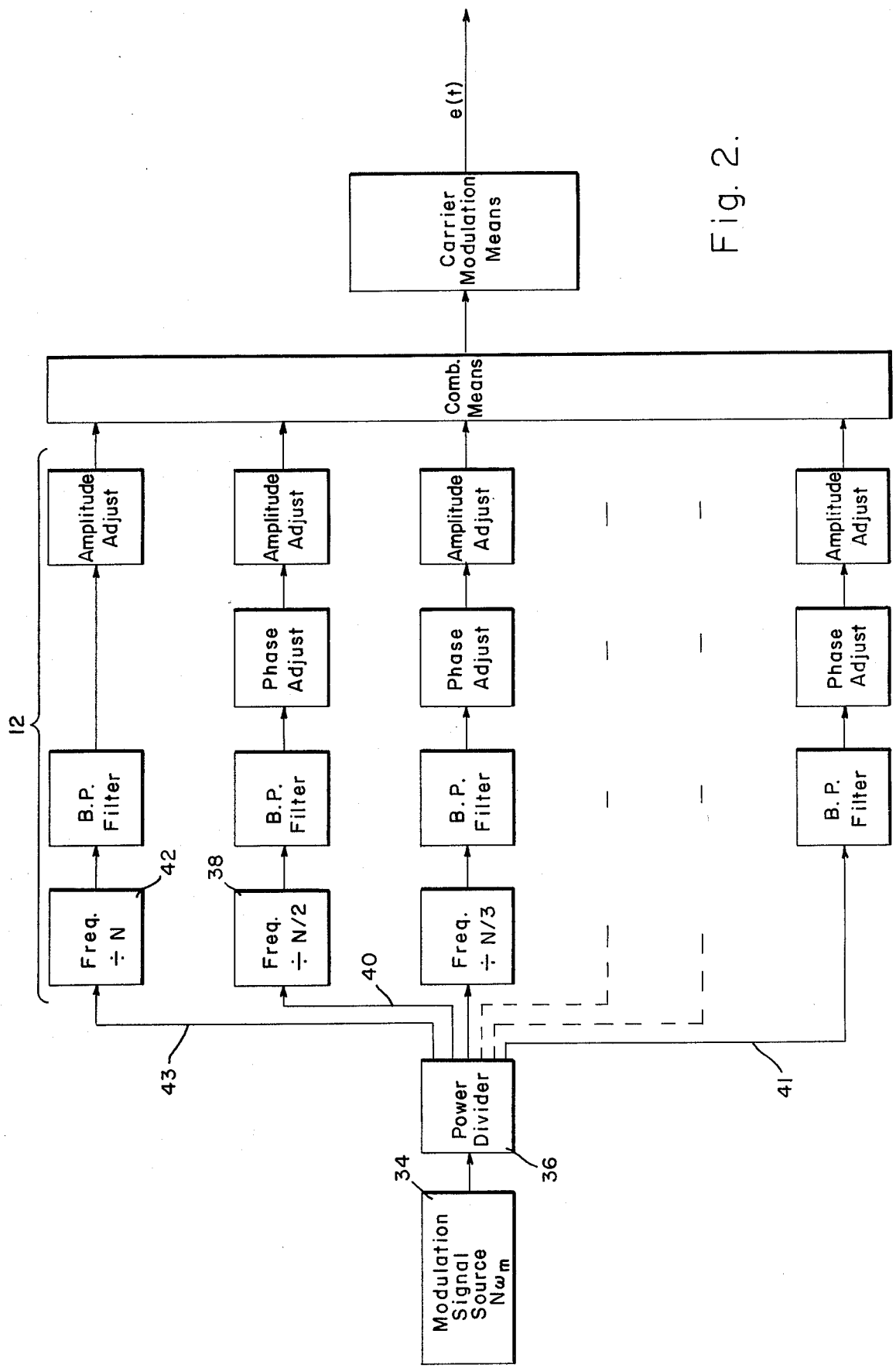
FIG. 2 is a schematic view of an alternative generalized embodiment of the present invention.

An alternative generalized form of the invention is shown in FIG. 2. This system varies from that of FIG. 1 by its method of frequency generation for modulating wave components. The modulation signal source 34 generates a sinusoid of N times the fundamental modulation frequency, or $N\omega_m$. As in the system of FIG. 1, this reference voltage is applied to the N conditioning channels of the modulation component conditioning means 12 through a power divider 36. The N conditioning channels of the modulation component conditioning means 12 of FIG. 2 vary from those of FIG. 1 by the use of frequency dividers, such as the divide-by-(N/2) circuit 38 of 2-harmonic channel 40. The N-harmonic channel 41 requires no divider whereas a divide-by-N circuit 42 is required for generation of the fundamental frequency $\omega_m$ in the fundamental channel 43. Such modification provides an equivalent system that is a useful alternative to that of FIG. 1 and is especially useful for the practice of the present invention with simplified digital circuitry.

In order that the present invention may be better understood, a theoretical explanation will now be given. It is to be understood, however, that this theoretical explanation is given merely for the purpose of exposition and in order that the invention may be better appreciated. While this theoretical explanation is believed to be correct, it is not of necessity complete, nor does the operation of the invention depend upon its accuracy or otherwise.

A sinusoidal wave of carrier frequency $\omega_c$ (expressed in radians per second) which is frequency modulated by a sinusoidal wave of frequency $\omega_m$ may be expressed: $e(t) = \sin(\omega_c t + \beta \sin\omega_m t)$. The factor $\beta$ is known as the modulation index or deviation ratio and is defined as $\Delta\omega \div \omega_m$, where $\Delta\omega$ represents the peak frequency deviation of the carrier from its unmodulated state. The spectrum amplitudes of the carrier and the sideband pairs of the modulated wave are proportional to the Bessel functions of the first kind $J_i(\beta)$. It is well known in the art that the selection of a value of $\beta$ such that $J_0(\beta) = J_1(\beta)$ results in equality of spectrum amplitude of the carrier and first order sideband pair. That is, a sinusoidal frequency modulated wave having $\beta$ such that $J_0(\beta) = J_1(\beta)$ has carrier and a (first sideband) pair of frequencies of equal power. This provides a modulated waveform, with no AM, whose spectrum consists of a carrier with the amplitude of the first order sideband pair equal to the carrier and the amplitude of higher order sidebands diminishing rapidly in magnitude. Due to its lack of amplitude ripple, this waveform can be passed through a non-linear amplifier with minimum distortion. Whereas this result has been well known, attempts to find a modulation index which would provide greater than three equal amplitude lines and hence additional benefits with simple sinusoidal FM have proven fruitless.

Expanding the above, a sinusoidal frequency modulated waveform wherein a carrier at frequency $\omega_c$ is modulated by a number of modulating frequencies each of which is an integral multiple of the fundamental modulating frequency $\omega_m$ and wherein there exists a phase shift $\alpha_i$ between any given modulating wave component may be expressed as:

$$e(t) = \sin(\omega_c t + \sum_{i=1}^{N} \beta_i \sin(i\omega_m t + \alpha_i))$$

where $\alpha_1 = 0$. The inventors herein have found that the spectrum of the above waveshape (a carrier modulated by some phased combination of sinusoids, each of which is a harmonic of a fundamental modulation frequency $\omega_m$) will exhibit the equality to a close approximation of amplitudes of the carrier and the adjacent L spectral lines on either side of the carrier if each of the modulating waves is scaled such that all $\beta_i$ are equal and for such $\beta_i$, $J_0(\beta_i) = J_1(\beta_i)$.

Extensive theoretical and experimental verification has been performed for the cases of seven equal line (three equal sideband pairs) and nine equal line (four equal sideband pairs) spectra. It has been found that both of such desired waveshapes may be generated by the combination of just two modulating sinusoids selected in accordance with the theory of the present invention.

The general expression for the frequency modulated wave generated by the combination of two modulating sinusoids is:

$$e(t) = \sin(\omega_c t + \beta_1 \sin a\omega_m t + \beta_2 \sin(b\omega_m t + \alpha)),$$

where a and b are positive integers. $\beta_1$ and $\beta_2$, the modulation indices, are, according to the theory of the present invention, selected equal and determined by the equation $J_0(\beta) = J_1(\beta)$. To obtain such equality, it can be shown that the peak frequency deviation due to the $b\omega_m$ frequency component is equal to $b\Delta\omega$ while that due to the $a\omega_m$ frequency component is $a\Delta\omega$. It has been determined analytically that the modulated waveform of the above type wherein $a = 1$, $b = 2$ and $\alpha = \pi/2$ has a seven equal line spectrum and that the modulated waveform wherein $a = 1$, $b = 3$ and $\alpha = \pi/2$ has a nine equal line spectrum. The result of a theoretical analysis of the spectrum of the above type modulated waveform wherein $a = 1$, $b = 3$, $\alpha = \pi/2$ is tabulated below:

| Sideband Order | Relative Power* | Power (dB) Relative To Carrier* |
|---|---|---|
| 0 (Carrier) | 1 | 0 dB |
| 1 | 1.17 | +0.69 dB |
| 2 | 1.14 | +0.59 dB |
| 3 | 1.02 | +0.08 dB |
| 4 | 1.02 | +0.09 dB |
| 5 | 0.312 | −5.12 dB |
| 6 | 0.167 | −7.8 dB |
| 7 | 0.156 | −8.08 dB |
| 8 | 0.034 | −14.6 dB |
| 9 | 0.011 | −19.5 dB |

*Values derived from the Fourier-Bessel expansion:

$$e(t) = \sum_{k=0}^{\infty} \sum_{n=0}^{\infty} \left\{ (-1)^{n+k} f(n,k) J_{2n}(\beta_2) \right.$$

-continued

| Sideband Order | Relative Power* | Power (dB) Relative To Carrier* |
|---|---|---|

$$\left[ J_{6n-k}(\beta_1) + (-1)^k J_{6n+k}(\beta_1) \right]$$

$$(\sin(\omega_c t + k\omega_m t) + (-1)^k \sin(\omega_c t - k\omega_m t))$$

$$+ (-1)^{n+k+1} J_{2n+1}(\beta_2) \left[ J_{6n+3-k}(\beta_1) + (-1)^{k+1} J_{6n+3+k}(\beta_1) \right]$$

$$\left. (\cos(\omega_c t + k\omega_m t) + (-1)^{k+1} \cos(\omega_c t - k\omega_m t)) \right\}$$

where
$f(n,k) = \frac{1}{4}$ when $n = k = 0$
$f(n,k) = \frac{1}{2}$ when $n = 0$ or $k = 0$, but not both
$f(n,k) = 1$ when $n > 0$ and $k > 0$ Calculations have been carried out to the ninth order sidebands of e(t). The second column illustrates the relative power, normalized to the carrier, of e(t) and the third column the relative power in dB. The power in each of the central nine lines is equal to within 0.69 dB. The power in the remaining sidebands decreases rapidly, as is seen. Approximately 88% of the power in the spectrum is contained in the "equal" lines with the remainder, 12%, in the higher order sidebands.

Figure 3A:
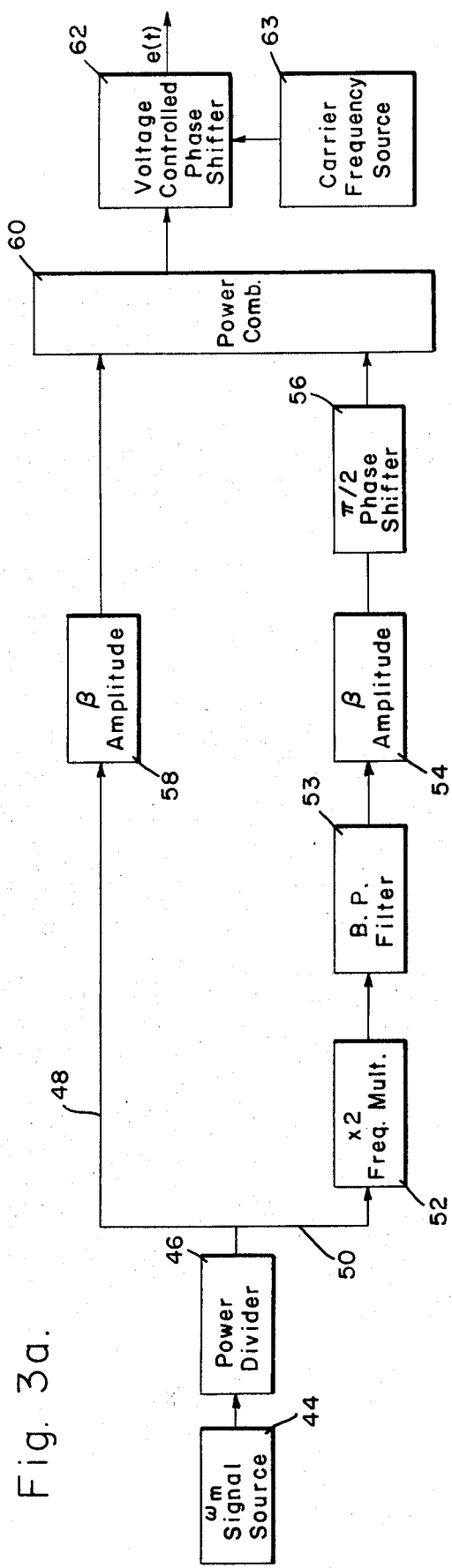
FIG. 3a is a schematic view of the seven equal line phase modulated circuit.

The seven equal line spectrum, the nine equal line spectrum, or any other given number of multi equal line spectra may be alternatively generated by means of a voltage controlled phase shifter (direct phase modulation) or a voltage controlled oscillator (frequency modulation). Thus, the modulating waveforms which must be applied to the control port of a voltage controlled phase shifter are (referring to the above paragraph): $\beta\sin\omega_m t + \beta\cos 2\omega_m t$ (seven equal spectral lines); $\beta\sin\omega_m t + \beta\cos 3\omega_m t$ (nine equal lines). These analytical results may be implemented within the scope of the generalized system of FIG. 1. In FIG. 3a there is presented the direct phase modulation version of the seven equal line system. A signal generator 44 inputs a sinusoid, $\sin\omega_m t$, to a two way power divider 46. The power divider 46 directs the sinusoid to a fundamental channel 48 and a harmonic channel 50. Within the harmonic channel 50, the sinusoid is increased in frequency by a frequency doubler 52, then filtered of undesired harmonics by a bandpass filter 53 adjusted to $2\omega_m$, to yield the sinusoid $\sin 2\omega_m t$. Its amplitude is increased in the amplifier 54 (since $\beta$ is greater than one and the signal generator 44 is presumed to produce a wave of unit amplitude) to $\beta$. This wave is finally shifted by 90° by a phase shifter 56 so that the output of the harmonic channel 50 is $\beta\cos 2\omega_m t$.

The only conditioning which occurs within the fundamental channel 48 is the $\beta$ amplitude adjustment of the amplifier 58. This adjusts the output of the fundamental channel to $\beta\sin\omega_m t$. The outputs of the fundamental channel 48 and the harmonic channel 50 are summed in a power combiner 60. The output of the power combiner 60, applied as the control voltage for voltage controlled phase shifter 62 (whose carrier frequency is supplied by the carrier frequency source 63), generates the phase modulated output waveshape e(t) = $\sin(\omega_c t + \beta\sin\omega_m t + \beta\cos 2\omega_m t)$. It can be shown that, when e(t) as above is expanded in a Fourier-Bessel series, the leading terms in the expansion for the amplitude of the carrier and first three pairs of sidebands are all approximately equal to $(J_0(\beta))^2$ while the remaining terms decrease rapidly in magnitude. Thus a spectrum with the first three sideband pairs equal in amplitude to the carrier to first order is predicted in accordance with the theory of the present invention. Similarly, in FIG. 3b there is shown the appropriate scaling for a modulation system which will generate the predicted nine equal line phase modulated waveform $e(t) = \sin(\omega_c t + \beta\sin\omega_m t + \beta\cos 3\omega_m t)$. The configuration of FIG. 3a is preserved with the exceptions of frequency tripler 64 and $3\omega_m$ bandpass filter 65 in place of frequency doubler 52 and $2\omega_m$ bandpass filter 53. The modulating waveform, applied as a control voltage to voltage controlled phase shifter 64, is shown in FIG. 4. In the Fourier-Bessel expansion for e(t), the leading terms in the expansion for the amplitude of the carrier and first four pairs of sidebands are all equal to $(J_0(\beta))^2$ to a first order approximation and the remaining terms decrease rapidly in magnitude. The numerical values predicted for the nine line spectrum, discussed supra, confirm the analysis.

Figure 3B:
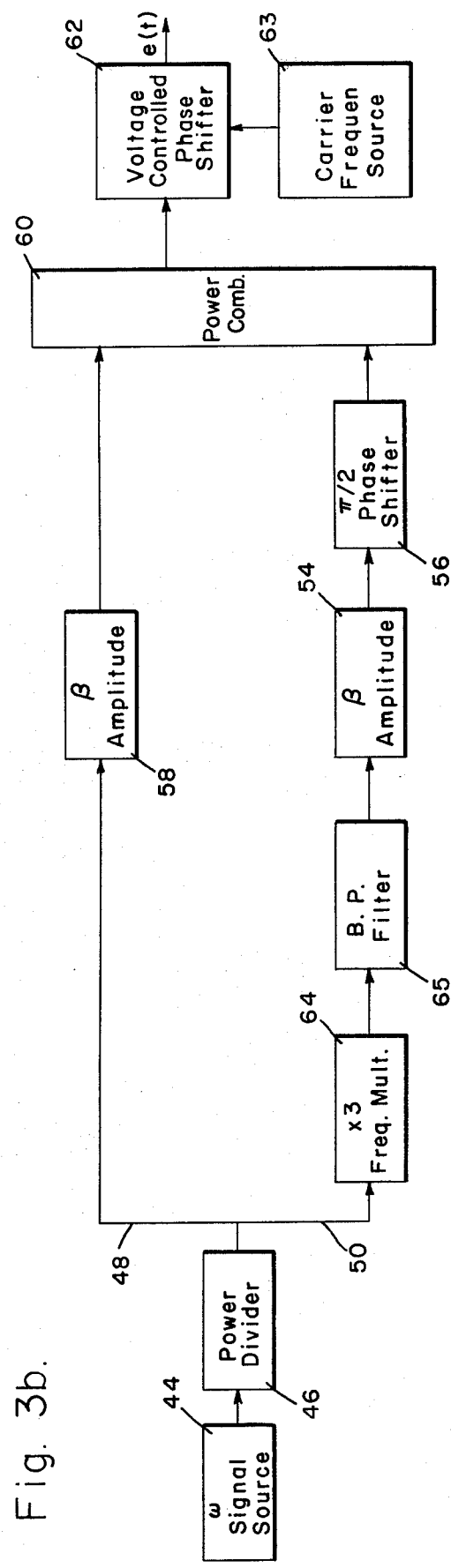
FIG. 3b is a schematic view of the nine equal line phase modulated circuit.
Figure 4:
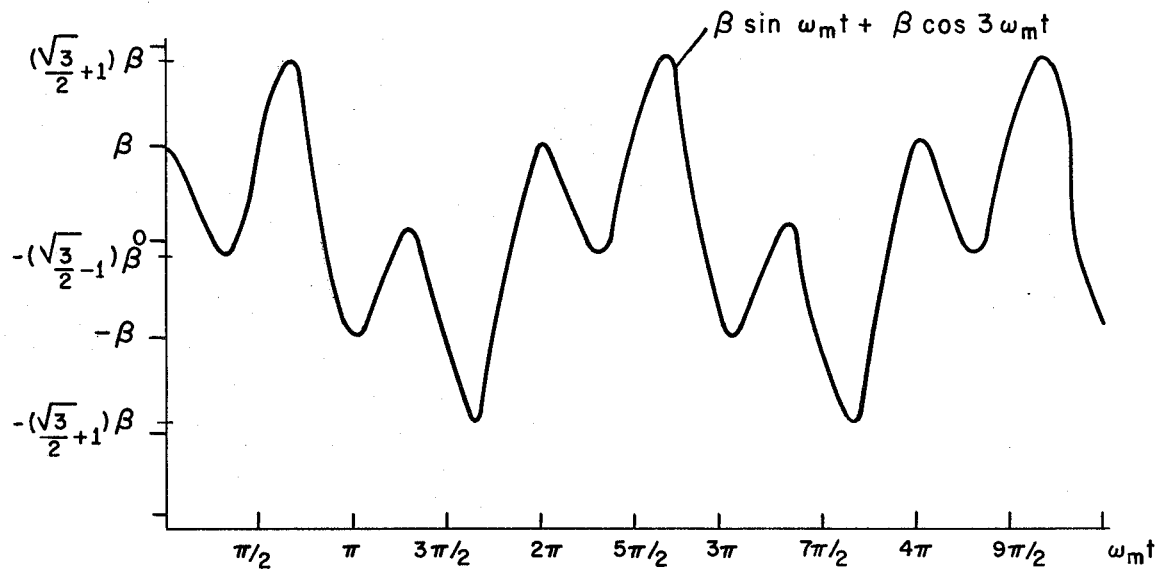
FIG. 4 is the modulating waveshape for the nine equal line phase modulation system.
Figure 5A:
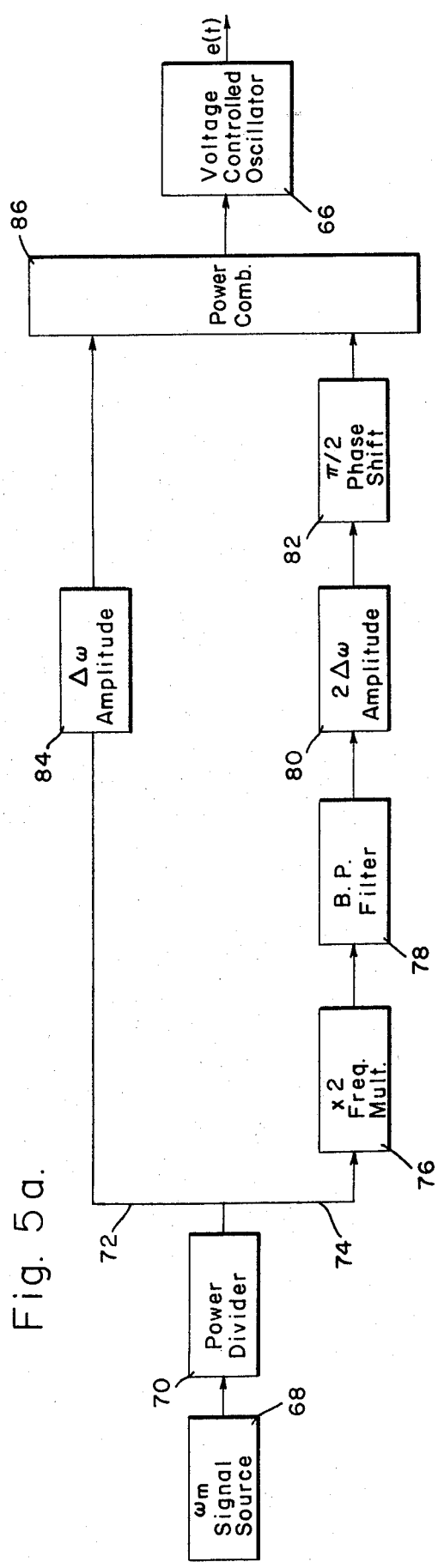
FIG. 5a is a schematic view of the seven equal line frequency modulated circuit.
Figure 5B:
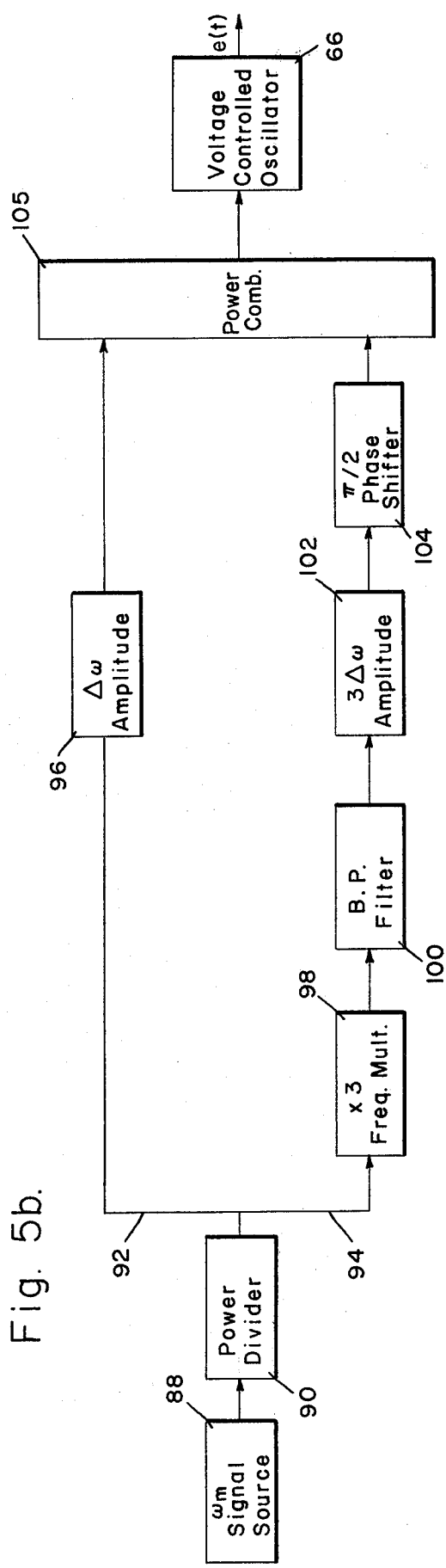
FIG. 5b is a schematic view of the nine equal line frequency modulated circuit.

FIGS. 5a and 5b are frequency modulation embodiments of the seven and nine spectral line systems of FIGS. 3a and 3b. Each of these systems has been implemented in the laboratory and found to generate the predicted spectra. Unlike the circuits of FIGS. 3a and 3b, those of FIGS. 5a and 5b employ a voltage controlled oscillator to frequency modulate the carrier. As will become apparent from the discussion to follow, such alteration will necessitate some redesign of system parameters as it is characteristic of a voltage controlled oscillator that a voltage applied at its control port will frequency modulate the VCO output. This is in contrast to the direct phase modulation, discussed supra, characteristic of a voltage controlled phase shifter. However, it has been shown that the resultant equations for both frequency and phase modulation yield identical outputs and that, consequently, the distribution of energy over the frequency spectrum existant in an FM waveform is identical to that of a PM waveform. (See, for example, Zeines, "Electronic Communication Systems" (1970) at page 406.) All variations remain within the scope of the general configurations of FIGS. 1 and 2 in that modulation entails the functions of fundamental frequency generation, modulation component conditioning, component combination and carrier modulation.

For a voltage controlled oscillator to generate the same modulated signal as that of a voltage controlled phase shifter, the oscillator's control voltage must be proportional to the rate of change of the phase shifter control voltage. This rate of change may be shown to be, respectively, $\Delta\omega\cos\omega_m t - 2\Delta\omega\sin 2\omega_m t$ (seven equal line spectrum frequency modulation function) and $\Delta\omega\cos\omega_m t - 3\Delta\omega\sin 3\omega_m$ (nine equal line spectrum frequency modulation function). The above control voltages as applied to a voltage controlled oscillator having the carrier as its unmodulated frequency will generate the desired spectra.

Figure 6:
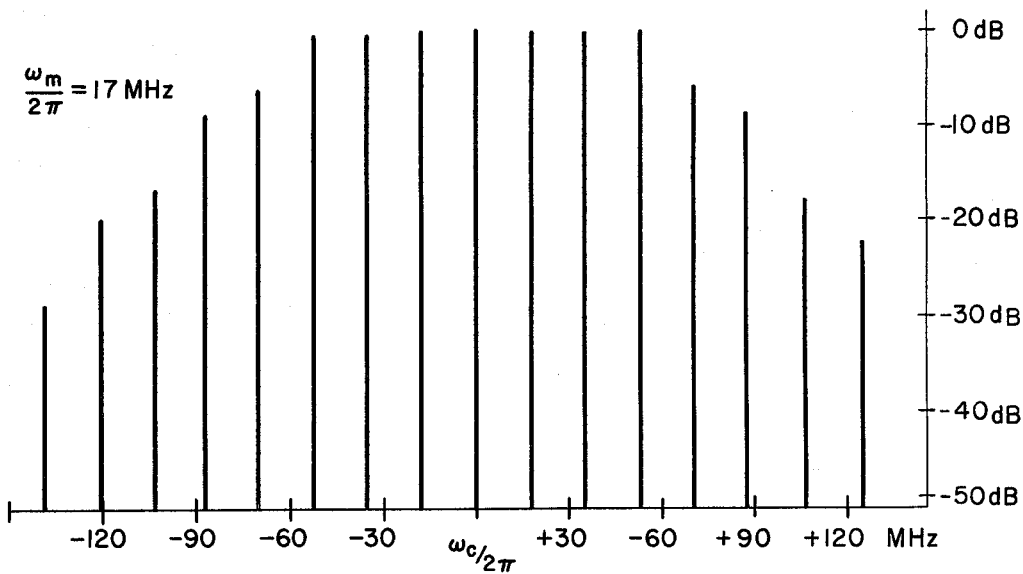
FIG. 6 is the seven equal line spectrum as displayed by a spectrum analyzer.

The proper modulating signal is generated and applied to the voltage controlled oscillator 66 by the modulating systems of FIGS. 5a and 5b. A signal generator 68 inputs a sinusoid $\cos\omega_m t$ to a two-way power divider 70 which, in turn, feeds this signal to the fundamental channel 72 and to a harmonic channel 74. The frequency doubler 76 is combined with a $2\omega_m$ bandpass filter 78 to transform the signal to $\cos 2\omega_m t$. This is adjusted to $2\Delta\omega\cos 2\omega_m t$ by an amplifier 80 ($\Delta\omega$ dimensionless). A ninety degree phase shifter 82 outputs $-2\Delta\omega\sin 2\omega_m t$. An amplifier 84 of the fundamental channel 72 adjusts the amplitude to $\Delta\omega$. A power combiner 86 sums the signal outputs of the fundamental channel 72 and the harmonic channel 74 to input the frequency modulating function $\Delta\omega\cos\omega_m t - 2\Delta\omega\sin 2\omega_m t$ to the control port of the voltage controlled oscillator 66. This function was applied to the control port of an X-band Gunn-Diode VCO to produce the spectrum shown in FIG. 6. The predicted characteristic of such a waveshape, namely (7) approximately equal amplitude spectrum lines, including the carrier, and a rapid fall off of the higher order sidebands is seen to be experimentally verified by the pattern as observed upon the screen of a spectrum analyzer.

The nine equal line frequency modulation system is shown in FIG. 5b. As in the case of the corresponding seven equal line system, a signal generator 88 produces a sinusoid $\cos\omega_m t$ which, when applied to a two-way power divider 90, directs the signal to a fundamental channel 92 and a harmonic channel 94. Within the fundamental channel a $\Delta\omega$ amplifier 96 provides the sole wave conditioning function. The harmonic channel 94 conditioning includes the operation of a frequency tripler 98 which, in conjunction with the $3\omega_m$ bandpass filter 100 produces the desired harmonic for a nine line spectrum, a $3\Delta\omega$ amplifier 102 and a ninety degree phase shifter 104. Thus the output of the harmonic channel 94 is $-3\Delta\omega\sin 3\omega_m$.

The outputs of the fundamental channel 92 and the harmonic channel 94 are summed in a power combiner 105 to input the modulating signal $\Delta\omega\cos\omega_m t - 3\Delta\omega\sin 3\omega_m$ to the control port of the voltage controlled oscillator 66. The waveshape of the modulating voltage is shown in FIG. 7.

Figure 7:
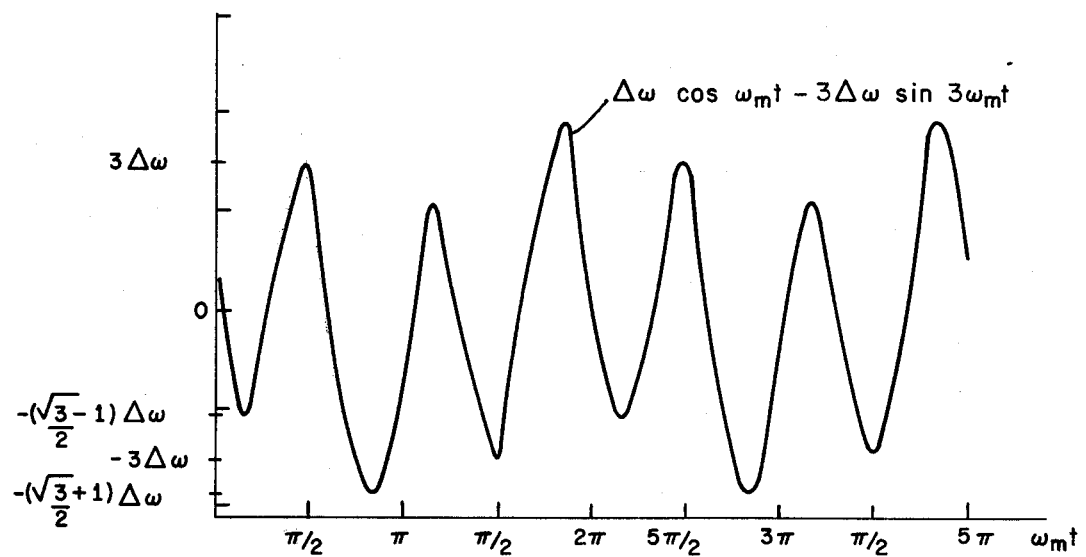
FIG. 7 is the modulating waveshape for the nine equal line frequency modulated system.
Figure 8:
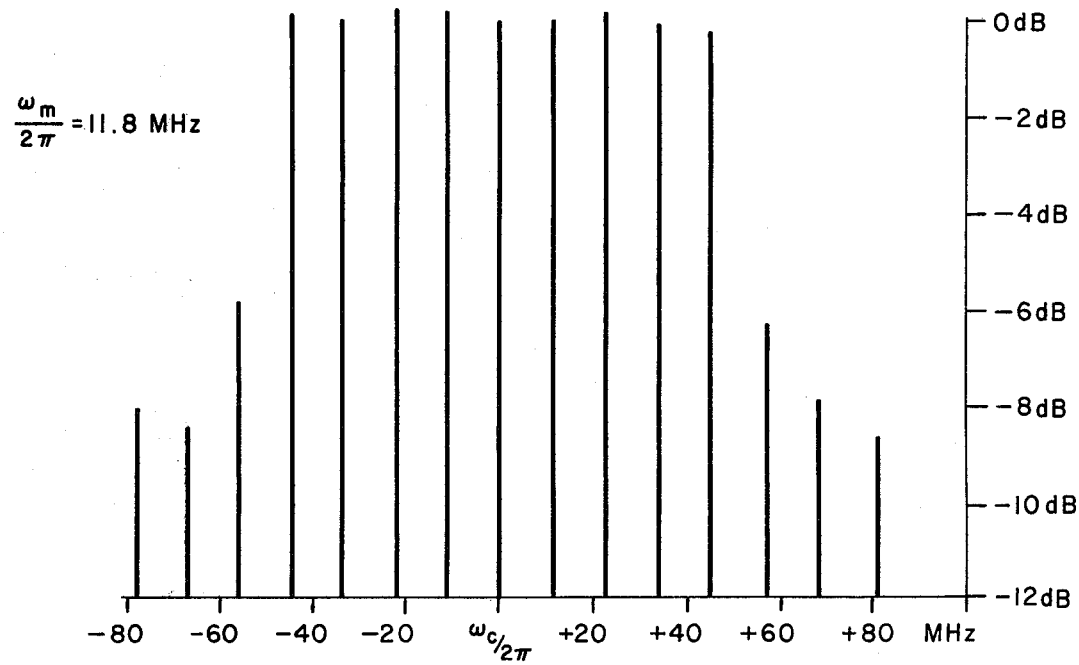
FIG. 8 is the nine equal line spectrum as displayed by a spectrum analyzer.

Output e(t) as shown on a spectrum analyzer for the system of FIG. 5b utilizing a Gunn-Diode voltage controlled oscillator with the modulating waveshape (at a fundamental modulation frequency $\omega_m/2\pi$ of approximately 11.8 MHz) of FIG. 7 as its control input is shown in 8. FIG. 8 shows a maximum power variation of 0.8 dB across the (9) lines of interest, which is in agreement with the tabulated analytical prediction above.

Greater-than-nine equal line spectra may be obtained by the present invention as generalized in FIGS. 1 and 2. Below is a tubulation of analytically derived multiple equal line spectra which can be generated when a modulating wave comprising the linear combination of one fundamental frequency and two harmonic frequencies (i.e., a three conditioning channel system) is employed according to the present invention. (It may be noted that the seven and nine equal line spectra as discussed above are generated by two conditioning channel systems.):

| $e(t) = \sin(\omega_c t + \beta\sin a\omega_m t + \beta\sin b\omega_m t + \beta\sin c\omega_m t)$ ||||
| a | b | c | Number of equal amplitude spectral lines |
|---|---|---|---|
| 1 | 2 | 3 | 13 |
| 1 | 2 | 4 | 15 |
| 1 | 2 | 5 | 17 |
| 1 | 2 | 6 | 19 |
| 1 | 2 | 7 | 21 |
| 1 | 3 | 4 | 17 |
| 1 | 3 | 5 | 19 |
| 1 | 3 | 6 | 21 |
| 1 | 3 | 7 | 23 |
| 1 | 3 | 8 | 25 |
| 1 | 3 | 9 | 27 |

Figure 9:
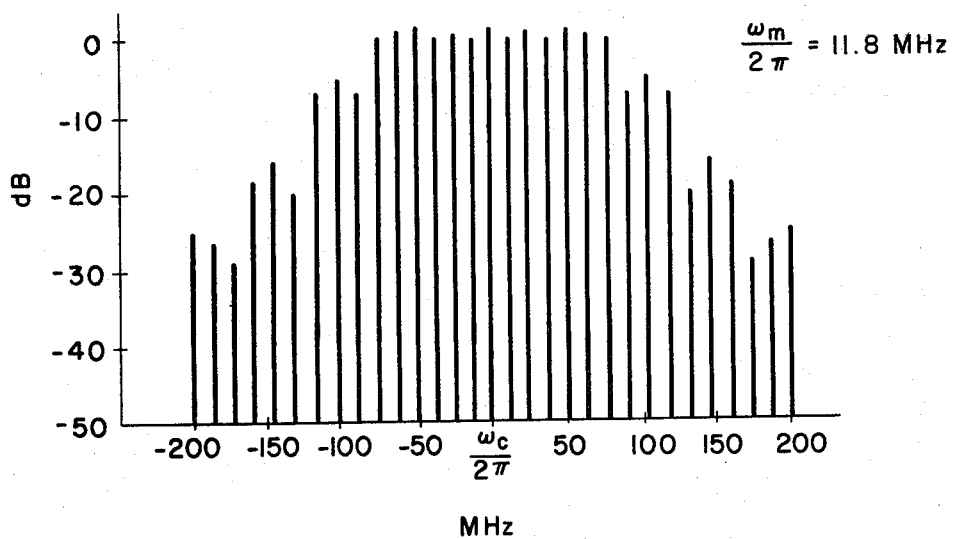
FIG. 9 is the thirteen equal line spectrum as displayed by a spectrum analyzer.

No phase shift is indicated; however, proper modulation component phasing may be systematically derived by (1) combining the (analytically determined) proper frequency channels in the power combiner with no phase shift therebetween, then (2) observing the modulated output of the voltage controlled oscillator or voltage controlled phase shifter on a spectrum analyzer such as the Hewlett Packard Model 141-T, and then (3) adjusting the phases of the two harmonic channels (in the adjustment ratio of 1:360 for instance) until the predicted number of equal spectral lines is observed. This combined analysis/adjustment method was utilized to generate the observed 13 line spectrum of FIG. 9. The procedure may be extended both in terms of the analytical determination of proper frequency components (derived from the extended Fourier-Bessel expansion of e(t)) and the systematic adjustment of phases.

Thus, it it seen that there is achieved by the present invention a modulation system for generating a modulated wave without amplitude ripple having multiple sideband pairs of power equal to that of the carrier. Various changes and modifications may be made without departing from the spirit of the invention, and all of such changes are contemplated as may come within the scope of the claims.

What is claimed is:

1. Apparatus for generating a modulated wave having the first three sideband pairs of power closely approximating the carrier which comprises:
    (a) means for producing a sinusoidal signal;
    (b) a fundamental channel having an input and an output;
    (c) a harmonic channel having an input and an output;
    (d) a power divider having an input, a first output and a second output, said input in electrical connection with said means for producing a sinusoidal signal to accept said signal, said first output in connection with said fundamental channel input and said second output in connection with second harmonic channel input to direct said signal to said fundamental channel and to said harmonic channel;
    (e) a first amplitude adjustment means in said fundamental channel to scale the amplitude of said signal to $\beta$ where $\beta$ is the solution of $J_0(\beta) = J_1(\beta)$;
    (f) a second amplitude adjustment means is said harmonic channel to scale the amplitude of said signal to $\beta$;
    (g) a frequency adjustment means to transform the frequency of said signal within said harmonic channel to two times a fundamental frequency $\omega_m$ and to transform the frequency of said signal within said fundamental channel to the fundamental frequency $\omega_m$;
    (h) a phase shift means is said harmonic channel to advance said signal in phase by 90°;
    (i) a power combiner having a fundamental channel input, a harmonic channel input and an output to add the output of said fundamental channel to that of said harmonic channel;
    (j) a voltage controlled phase shifter having a control input and a carrier input and an output channel;
    (k) a carrier signal source to supply a sinusoidal carrier signal to the carrier input of said voltage controlled phase shifter; and
    (l) the output of said power combiner being input to said control input of said voltage controlled phase shifter whereby the carrier signal is phase modulated by the output of said power combiner.

2. Apparatus for generating a modulated wave having the first four sideband pairs of power closely approximating the carrier which comprises:
    (a) means for producing a sinusoidal signal;
    (b) a fundamental channel having an input and and output;
    (c) a harmonic channel having an input and an output;
    (d) a power divider having an input, a first output and a second output, said input in electrical connection with said means for producing a sinusoidal signal to accept said signal, said first output in connection with said fundamental channel input and said second output in connection with second harmonic channel input to direct said signal to said fundamental channel and to said harmonic channel;
    (e) a first amplitude adjustment means in said fundamental channel to scale the amplitude of said signal to $\beta$ where $\beta$ is the solution of $J_0(\beta) = J_1(\beta)$;
    (f) a second amplitude adjustment means in said harmonic channel to scale the amplitude of said signal to $\beta$;
    (g) a frequency adjustment means to transform the frequency of said signal within said harmonic channel to three times a fundamental frequency $\omega_m$ and to transform the frequency of said signal within said fundamental channel to said fundamental frequency $\omega_m$;
    (h) a phase shift means in said harmonic channel to advance said signal in phase by 90°;
    (i) a power combiner having a fundamental channel input, a harmonic channel input and an output to add the output of said fundamental channel to that of said harmonic channel;
    (j) a voltage controlled phase shifter having a control input and a carrier input and an output channel;
    (k) a carrier signal source to supply a sinusoidal carrier signal to the carrier input of said voltage controlled phase shifter; and
    (l) the output of said power combiner being input to said control input of said voltage controlled phase shifter whereby the carrier signal is phase modulated by the output of said power combiner.

3. Apparatus for generating a modulated wave having multiple sideband pairs of power closely approximating the carrier which comprises:
    (a) means for producing a sinusoidal signal;
    (b) a fundamental channel having an input and an output;
    (c) at least one harmonic channel having an input and an output;
    (d) a power divider having an input and a plurality of outputs, said input in electrical connection with said means for producing a sinusoidal signal to accept said signal, and each output in electrical connection with the input of a channel to direct said signal to said fundamental channel and to said at least one harmonic channel;
    (e) a first amplitude adjustment means in said fundamental channel to scale the amplitude of said signal to $\beta$ where $\beta$ is the solution of $J_0(\beta) = J_1(\beta)$;
    (f) an amplitude adjustment means in each of said harmonic channels to scale the amplitude of said signal to $\beta$;
    (g) frequency adjustment means in each of said channels to transform the frequency of said signal within each of said harmonic channels to an integer multiple of a fundamental frequency $\omega_m$ and to transform the frequency of said signal within said fundamental channel to said fundamental frequency $\omega_m$;

(h) a power combiner to add the outputs of selected channels wherein said outputs are combined according to the amplitudes of the terms of the Fourier-Bessel expansion for a carrier modulated by a signal comprised of a number of frequencies, each of which is an integer multiple of a fundamental frequency;

(i) a voltage controlled phase shifter having a control input, a carrier input and an output channel;

(j) a carrier signal source to supply a sinusoidal carrier signal to the carrier input of said voltage controlled phase shifter;

(k) the output of said power combiner being input to said control input of said voltage controlled phase shifter whereby the carrier signal is phase modulated by the output of said power combiner; and (l) a variable phase shift means in each of said harmonic channels to systematically adjust the relative phase of each harmonic channel to achieve said equal amplitude spectrum as predicted by said Fourier-Bessel expansion.

4. Apparatus for generating a modulated wave having multiple sideband pairs of power closely approximating the carrier as defined in claim 3 wherein:

(a) said power combiner adds the outputs of said fundamental channel and of one harmonic channel;

(b) said frequency adjustment means transforms the frequency of said signal within said harmonic channel to $2\omega_m$ and transforms the frequency of said signal within said fundamental channel to $\omega_m$; and (c) said variable phase shift means of said harmonic channel is adjusted to a 90° forward phase shift.

5. Apparatus for generating a modulated wave having multiple sideband pairs of power closely approximating the carrier as defined in claim 3 wherein:

(a) said power combiner adds the outputs of said fundamental channel and of one harmonic channel;

(b) said frequency adjustment means transforms the frequency of said signal within said harmonic channel to $3\omega_m$ and transforms the frequency of said signal within said fundamental channel to $\omega_m$; and (c) said variable phase shift means of said harmonic channel is adjusted to a 90° forward phase shift.

6. Apparatus for generating a modulated wave having the first three sideband pairs of power closely approximating the carrier which comprises:

(a) means for producing a sinusoidal signal;

(b) a fundamental channel having an input and an output;

(c) a harmonic channel having an input and an output;

(d) a power divider having an input, a first output and a second output, said input in electrical connection with said means for producing a sinusoidal signal to accept said signal, said first output in connection with said fundamental channel input and said second output in connection with second harmonic channel input to direct said signal to said fundamental channel and to said harmonic channel;

(e) a frequency adjustment means to transform the frequency of said signal within said harmonic channel to two times a fundamental frequency $\omega_m$ and to transform the frequency of said signal within said fundamental channel to said fundamental frequency $\omega_m$;

(f) a first amplitude adjustment means in said fundamental channel to scale the amplitude of said signal to $\Delta\omega$ where $\Delta\omega$ is the solution of $$J_0(\frac{\Delta\omega}{\omega_m}) = J_1(\frac{\Delta\omega}{\omega_m});$$

(g) a second amplitude adjustment means in said harmonic channel to scale the amplitude of said signal to $2\Delta\omega$;

(h) a phase shift means in said harmonic channel to advance said signal in phase by 90°;

(i) a power combiner having a fundamental channel input, a harmonic channel input and an output to add the output of said fundamental channel to that of said harmonic channel;

(j) a voltage controlled oscillator whose unmodulated frequency is at the carrier frequency;

(k) said voltage controlled oscillator having a control input and an output channel; and (l) the output of said power combiner being input to said control input of said voltage controlled oscillator whereby the carrier signal is frequency modulated by the output of said power combiner.

7. Apparatus for generating a modulated wave having the first four sideband pairs of power closely approximating the carrier which comprises:

(a) means for producing a sinusoidal signal;

(b) a fundamental channel having an input and an output;

(c) a harmonic channel having an input and an output;

(d) a power divider having an input, a first output and a second output, said input in electrical connection with said means for producing a sinusoidal signal to accept said signal, said first output in connection with said fundamental channel input and said second output in connection with second harmonic channel input to direct said signal to said fundamental channel and to said harmonic channel;

(e) a frequency adjustment means to transform the frequency of said signal within said harmonic channel to three times a fundamental frequency $\omega_m$ and to transform the frequency of said signal within said fundamental channel to said fundamental frequency $\omega_m$;

(f) a first amplitude adjustment means in said fundamental channel to scale the amplitude of said signal to $\Delta\omega$ where $\Delta\omega$ is the solution of $$J_0(\frac{\Delta\omega}{\omega_m}) = J_1(\frac{\Delta\omega}{\omega_m});$$

(g) a second amplitude adjustment means in said harmonic channel to scale the amplitude of said signal to $3\Delta\omega$;

(h) a phase shift means in said harmonic channel to advance said signal in phase by 90°;

(i) a power combiner having a fundamental channel input, a harmonic channel input and an output to add the output of said fundamental channel to that of said harmonic channel;

(j) a voltage controlled oscillator whose unmodulated frequency is at the carrier frequency;

(k) said voltage controlled oscillator having a control input and an output channel; and (l) the output of said power combiner being input to said control input of said voltage controlled oscillator whereby the carrier signal is frequency modulated by the output of said power combiner.

8. Apparatus for generating a modulated wave having multiple sideband pairs of power closely approximating the carrier which comprises:

(a) means for producing a sinusoidal signal;

(b) a fundamental channel having an input and and output;

(c) at least one harmonic channel having an input and an output;

(d) a power divider having an input and a plurality of outputs, said input in electrical connection with said means for producing a sinusoidal signal to accept said signal, and each output in electrical connection with the input of a channel to direct said signal to said fundamental channel and to said at least one harmonic channel;

(e) a frequency adjustment means in each of said channels to transform the frequency of said signal within each of said harmonic channels to integer multiple of a fundamental frequency $\omega_m$ and to transform the frequency of said signal within said fundamental channel to said fundamental frequency $\omega_m$;

(f) a first amplitude adjustment means in said fundamental channel to scale the amplitude of said signal to $\Delta\omega$ where $\Delta\omega$ is the solution of $$J_0\left(\frac{\Delta\omega}{\omega_m}\right) = J_1\left(\frac{\Delta\omega}{\omega_m}\right);$$

(g) an amplitude adjustment means in each of said harmonic channels to scale the amplitude of said signal to $i\Delta\omega$ where i is the integer frequency multiple of said harmonic channel;

(h) a power combiner to add the outputs of selected channels wherein said outputs are combined according to the amplitudes of the terms of the Fourier-Bessel expansion for a carrier modulated by a signal comprised of a number of frequencies, each of which is an integer multiple of a fundamental frequency;

(i) a voltage controlled oscillator whose unmodulated frequency is at the carrier frequency;

(j) said voltage controlled oscillator having a control input and an output channel;

(k) the output of said power combiner being input to said control input of said voltage controlled oscillator whereby the carrier signal is frequency modulated by the output of said power combiner; and (l) a variable phase shift means in each of said harmonic channels to systematically adjust the relative phase of each harmonic channel to achieve said equal amplitude spectrum as predicted by said Fourier-Bessel expansion.

9. Apparatus for generating a modulated wave having multiple sideband pairs of power closely approximating the carriers as defined in claim 8 wherein:

(a) said power combiner adds the outputs of said fundamental channel and of one harmonic channel;

(b) said amplitude adjustment means of said harmonic channel scales the amplitude of said signal to $2\Delta\omega_m$;

(c) said frequency adjustment means transforms the frequency of said signal within said harmonic channel to $2\omega_m$ and transforms the frequency of said signal within said fundamental channel to $\omega_m$; and (d) said variable phase shift means of said harmonic channel is adjusted to a 90° forward phase shift.

10. Apparatus for generating a modulated wave having multiple sideband pairs of power closely approximating the carrier as defined in claim 8 wherein:

(a) said power combiner adds the outputs of said fundamental channel and of one harmonic channel;

(b) said amplitude adjustment means of said harmonic channel scales the amplitude of said signal to $3\Delta\omega_m$;

(c) said frequency adjustment means transforms the frequency of said signal within said harmonic channel to $3\omega_m$ and transforms the frequency of said signal within said fundamental channel to $\omega_m$; and (d) said variable phase shift means of said harmonic channel is adjusted to a 90° forward phase shift.

11. Apparatus for generating a modulated wave having multiple sideband pairs of power closely approximating the carrier which comprises:

(a) means for producing a sinusoidal signal;

(b) a fundamental channel having an input and an output;

(c) at least one harmonic channel having an input and an output;

(d) a power divider having an input and a plurality of outputs, said input in electrical connection with said means for producing a sinusoidal signal to accept said signal, and each output in electrical connection with the input of a channel to direct said signal to said fundamental channel and to said at least one harmonic channel;

(e) a first amplitude adjustment means in said fundamental channel to scale the amplitude of said signal to the value y which is proportional to x where x is the solution of $J_0(x) = J_1(x)$;

(f) an amplitude adjustment means in each of said harmonic channels to scale the amplitude of said signal to said value y;

(g) frequency adjustment means in each of said channels to transform the frequency of said signal within each of said harmonic channels to an integer multiple of a fundamental frequency $\omega_m$ and to transform the frequency of said signal within said fundamental channel to said fundamental frequency $\omega_m$;

(h) a power combiner to add the outputs of selected channels wherein said outputs are combined according to the amplitudes of the terms of the Fourier-Bessel expansion for a carrier modulated by a signal comprised of a number of frequencies, each of which is an integer multiple of a fundamental frequency;

(i) a carrier modulation means having an input and an output wherein a signal applied at said input modulates the carrier frequency of said carrier modulation means;

(j) the output of said power combiner being input to said input of said carrier modulation means whereby the carrier signal is modulated by the output of said power combiner; and (k) a variable phase shift means in each of said harmonic channels to systematically adjust the relative phase of each harmonic channel to achieve said equal amplitude spectrum as predicted by said Fourier-Bessel expansion.

* * * * *

UNITED STATES PATENT AND TRADEMARK OFFICE
CERTIFICATE OF CORRECTION

PATENT NO. : 4,130,811
DATED : December 19, 1978
INVENTOR(S) : Joel Katz and Eugene H. Gregory It is certified that error appears in the above-identified patent and that said Letters Patent are hereby corrected as shown below:

Column 1, line 1, please insert:

"The Government has rights in this invention pursuant to Contract No. F33657-76-C-0603, awarded by the Department of the Air Force."

Signed and Sealed this

Third Day of June 1980

[SEAL]

*Attest:*

*Attesting Officer*

SIDNEY A. DIAMOND

*Commissioner of Patents and Trademarks*